(12) United States Patent
Yamagata et al.

(10) Patent No.: US 7,894,139 B2
(45) Date of Patent: Feb. 22, 2011

(54) IMAGING APPARATUS AND METHOD FOR MANUFACTURING MICROLENS ARRAY

(75) Inventors: Michihiro Yamagata, Osaka (JP); Kenichi Hayashi, Ikoma (JP); Hiroaki Okayama, Osaka (JP)

(73) Assignee: Panasonic Corporation, Osaka (JP)

(*) Notice: Subject to any disclaimer, the term of this patent is extended or adjusted under 35 U.S.C. 154(b) by 841 days.

(21) Appl. No.: 10/570,051

(22) PCT Filed: Apr. 26, 2005

(86) PCT No.: PCT/JP2005/007864

§ 371 (c)(1),
(2), (4) Date: Feb. 27, 2006

(87) PCT Pub. No.: WO2005/107243

PCT Pub. Date: Nov. 10, 2005

(65) Prior Publication Data

US 2009/0141361 A1    Jun. 4, 2009

(30) Foreign Application Priority Data

Apr. 28, 2004    (JP) .............................. 2004-134302

(51) Int. Cl.
*G02B 27/10* (2006.01)

(52) U.S. Cl. .................. 359/619; 359/625; 359/628

(58) Field of Classification Search ................. 359/619, 359/625, 628
See application file for complete search history.

(56) References Cited

U.S. PATENT DOCUMENTS

| | | | |
|---|---|---|---|
| 4,175,844 A | 11/1979 | Glaser-Inbari | |
| 6,211,916 B1 | 4/2001 | Hawkins et al. | |
| 6,304,384 B1 * | 10/2001 | Nishikawa | .................. 359/619 |
| 6,839,178 B2 * | 1/2005 | Uchiyama et al. | ........... 359/620 |
| 2004/0012698 A1 | 1/2004 | Suda et al. | |

FOREIGN PATENT DOCUMENTS

| | | |
|---|---|---|
| EP | 1 079 613 | 2/2001 |
| JP | 59-50042 | 12/1984 |
| JP | 6-224398 | 8/1994 |
| JP | 9-307697 | 11/1997 |
| JP | 2000-307090 | 11/2000 |
| JP | 2001-61109 | 3/2001 |
| JP | 2001-68657 | 3/2001 |
| JP | 2002-280532 | 9/2002 |
| JP | 2003-78826 | 3/2003 |

* cited by examiner

*Primary Examiner*—Jack Dinh
(74) *Attorney, Agent, or Firm*—Hamre, Schumann, Mueller & Larson, P.C.

(57) ABSTRACT

An imaging device (3) including a plurality of pixels (3a) having a photoelectric conversion function, and a microlens array (1) including a plurality of microlenses (1a) that form subject images on these plurality of pixels (3a) and are arranged in a matrix are disposed so as to face each other. The microlens array (1) includes grooves (20) in a lattice form between the microlenses (1a) that are adjacent to each other. The depth of the grooves (20) is larger than a half of the thickness of the microlens array (1). Accordingly, it is possible to achieve an imaging apparatus that is easy to manufacture, has a simplified configuration and can capture a clear image and in which an influence of stray light and cross talk are reduced sufficiently.

10 Claims, 7 Drawing Sheets

IMAGING APPARATUS AND METHOD FOR MANUFACTURING MICROLENS ARRAY

TECHNICAL FIELD

The present invention relates to an imaging apparatus. In particular, the present invention relates to an imaging apparatus in which a microlens array including a plurality of microlenses is arranged on a subject side of an imaging device having a large number of pixels. Further, the present invention relates to a method for manufacturing this microlens array.

BACKGROUND ART

In a digital still camera market that has been expanding in recent years, there is a growing need for a small and thin camera having greater portability. Circuit components such as LSIs for performing a signal processing have been miniaturized with a high functionality by achieving finer wiring patterns. Also, small recording media with a large capacity have become available at low cost. However, an imaging system constituted by a lens and a solid-state imaging device such as a CCD or a CMOS has not been miniaturized sufficiently, and it is desired that a small imaging system be developed also for realizing a camera with greater portability.

As a configuration for achieving the miniaturization of the imaging system, a configuration using a lens array optical system in which a plurality of microlenses are arranged on a plane has been known. The use of the lens array optical system makes it possible to reduce the thickness of the imaging system in an optical axis direction, and to keep an aberration to be relatively small because individual microlenses have a small diameter.

JP 59(1984)-50042 B discloses an imaging system using such a lens array. This imaging system includes a microlens array having a plurality of microlenses arranged in a plane, a pinhole mask having a plurality of pinholes formed in a plane so as to be in a one-to-one correspondence with the microlenses and an image plane in which light that has passed through each of the pinholes forms an image, in this order from a subject side. Each of the microlenses forms a reduced image of the subject on the pinhole mask, and the individual pinholes allow light corresponding to different portions of this reduced image to pass through (i.e., they sample the light). As a result, a subject image is formed on the image plane.

However, in the above-described imaging system disclosed by JP 59(1984)-50042 B, since the resolution of the subject image formed on the image plane depends on the number and density of the microlenses (namely, the pinholes), it has been difficult to improve an image quality. In other words, because the arrangement of units each constituted by a pair of the microlens and the pinhole determines the arrangement of sampling spots of the image to be obtained, in order to achieve a higher image quality, it is necessary both to increase the number of the above-mentioned units and thus the number of sampling spots and to reduce the size of the individual microlenses and thus an arrangement pitch of the above-mentioned units. However, there is a limit on the miniaturization of the microlenses, so that it has been difficult to achieve a higher resolution. Further, since a light flux reaching the image plane is restricted by the pinholes, there is a significant loss of the light amount, leading to a problem in sensitivity.

Figure 12:
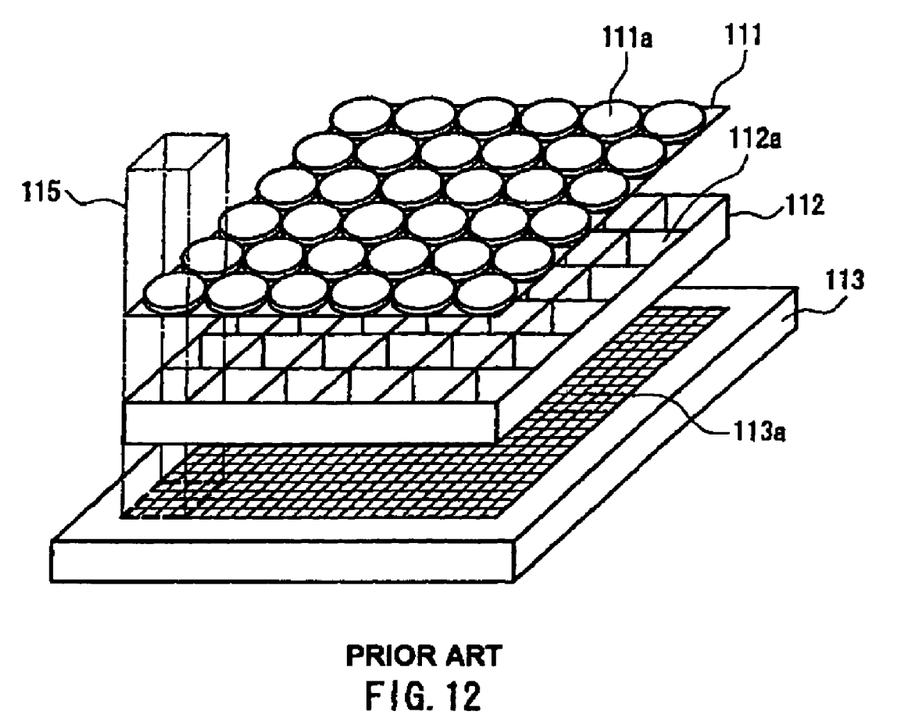
FIG. 12 is an exploded perspective view showing a schematic configuration of a conventional imaging apparatus.

JP 2001-61109 A discloses an imaging system using another lens array that solves the problem described above. As shown in FIG. 12, this imaging apparatus includes a microlens array 111 having a plurality of microlenses 111a arranged in the same plane, a partition layer 112 formed of a lattice-shaped partition 112a for separating optical signals from the individual microlenses 111a so as not to interfere with each other and a light-receiving element array 113 having a large number of photoelectric conversion elements 113a arranged in the same plane, in this order from a subject side. One microlens 111a, one corresponding space isolated by the partition 112a and a plurality of the photoelectric conversion elements 113a form one image forming unit 115. In each image forming unit 115, the microlens 111a forms a subject image on the plurality of the photoelectric conversion elements 113a corresponding to this microlens 111a. In this manner, a captured image is obtained for each image forming unit 115. The resolution of this captured image depends on the number of the photoelectric conversion elements 113a (the number of pixels) forming one image forming unit 115. Since positions of the individual microlenses 111a relative to the subject are different, the position at which the subject image is formed on the plurality of the photoelectric conversion elements 113a differs from one image forming unit 115 to another. Consequently, the obtained captured image differs from one image forming unit 115 to another. These plural captured images that are different from each other are subjected to signal processing, thereby achieving a single image.

In this imaging apparatus, since the number of pixels forming each image forming unit 115 is small, the captured image obtained by each image forming unit 115 has a low quality. However, by carrying out the signal processing using the captured images that are obtained respectively by the plural image forming units 115 and shifted slightly from each other and re-forming an image, it is possible to achieve a picture whose image quality is as high as an image captured using a large number of photoelectric conversion elements.

DISCLOSURE OF INVENTION

Problem to be Solved by the Invention

In the imaging apparatus shown in FIG. 12, when light from the microlens 111a enters the photoelectric conversion element 113a of an adjacent image forming unit 115, which does not correspond to this microlens 111a (this phenomenon is called "cross talk"), stray light is generated, so that a high quality image cannot be re-formed or light loss occurs. The partition layer 112 is provided for preventing this cross talk.

If the partition 112a becomes thicker (in a direction parallel with the plane in which the photoelectric conversion elements 113a are arranged), the number of the photoelectric conversion elements 113a included in one image forming unit 115 decreases, thus lowering the image quality. Therefore, it is preferable that the partition 112a is thin.

However, a thinner partition 112a makes it difficult to manufacture the partition layer 112 and assemble the imaging apparatus.

It is an object of the present invention to solve the conventional problem described above and to provide an imaging apparatus that is easy to manufacture.

Means for Solving Problem

An imaging apparatus according to the present invention includes an imaging device including a plurality of pixels having a photoelectric conversion function, and a microlens array including a plurality of microlenses that form subject images on the plurality of pixels in the imaging device and are arranged in a matrix. Also, the microlens array includes grooves in a lattice form between the microlenses that are adjacent to each other, and a depth of the grooves is larger than a half of a thickness of the microlens array.

A first method for manufacturing a microlens array according to the present invention includes obtaining by resin molding a microlens array whose one surface is provided with a plurality of spherical or aspherical microlenses and whose other surface is flat, and forming grooves in a lattice form on the other surface of the microlens array by a light irradiation from the other surface.

A second method for manufacturing a microlens array according to the present invention includes obtaining a microlens array whose one surface is provided with a plurality of spherical or aspherical microlenses and whose other surface is provided with grooves in a lattice form and is flat except for the grooves, and processing lateral surfaces of the grooves to be black by injecting a solution prepared by dissolving a black coating material in a solvent into the grooves.

Effects of the Invention

In accordance with the present invention, since a portion having a function similar to the conventional partition is provided in the microlens array, it is possible to achieve an imaging apparatus that is easy to manufacture, has a simplified configuration and can capture a clear image and in which an influence of stray light and cross talk are reduced sufficiently.

DESCRIPTION OF THE INVENTION

In the above-described imaging apparatus according to the present invention, it is preferable that a material of the microlens array is formed of a light-transmitting resin. This reduces the light loss and makes it possible to capture a clear image. Further, the use of the resin material allows easy manufacturing.

Also, in the above-described imaging apparatus according to the present invention, it is preferable that the microlens array is a plano-convex lens array whose one surface is provided with the microlenses and whose other surface is provided with the grooves and faces the imaging device. This makes it possible to reduce the influence of stray light and cross talk sufficiently within the limited range of the thickness.

Further, in the above-described imaging apparatus according to the present invention, it is preferable that a light-absorbing material is applied to lateral surfaces of the grooves. This makes it possible to reduce stray light and cross talk further.

In this case, it is preferable that the light-absorbing material is black. This makes it possible to reduce stray light and cross talk further.

Moreover, in the above-described imaging apparatus according to the present invention, it is preferable that a width of the grooves increases toward the imaging device. In this way, when the microlens array is formed with a mold, it is released from the mold more easily, thus improving the productivity.

Additionally, in the above-described imaging apparatus according to the present invention, it is preferable that a second material having a smaller light transmittance than a first material forming the microlens array is filled in the grooves. This makes it possible to reduce stray light and cross talk further. Moreover, the second material is filled in the grooves, whereby the strength of the microlens array improves.

In this case, it is preferable that the second material contains a material having a light-absorption function. This prevents light entering the second material from leaving this second material, and thus it is possible to reduce stray light and cross talk further.

It also is preferable that the second material has a larger refractive index than the first material. In this way, the total-reflection does not occur easily at an interface between the first material and the second material, so that light entering this interface from the first material enters the second material more easily. As a result, it is possible to prevent stray light, which is generated by the reflection of the light at the interface.

Furthermore, in the above-described imaging apparatus according to the present invention, it is preferable that the microlens array is manufactured by resin molding. This makes it possible to manufacture the microlens array efficiently.

Moreover, in the above-described first method for manufacturing a microlens array according to the present invention, it is preferable further to include processing lateral surfaces of the grooves to be black by injecting a solution prepared by dissolving a black coating material in a solvent into the grooves. This makes it possible to coat the lateral surfaces of the grooves with the black coating simply and efficiently.

The following is a description of embodiments of the present invention, with reference to the accompanying drawings.

EMBODIMENT 1

Figure 1:
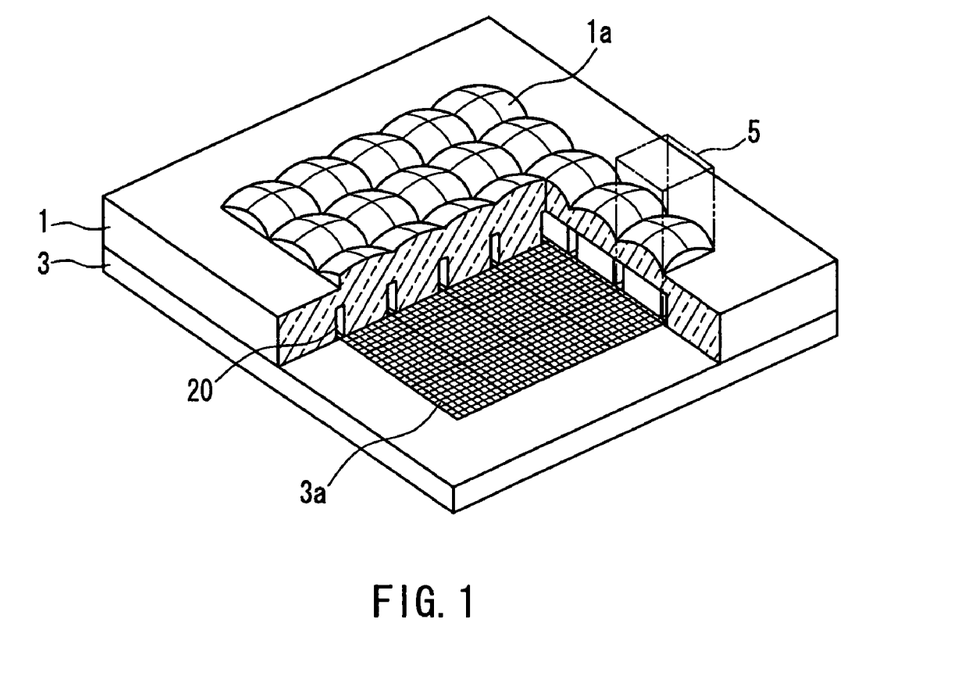
FIG. 1 is a partially broken perspective view showing an imaging apparatus according to Embodiment 1 of the present invention.

FIG. 1 is a partially broken perspective view showing an imaging apparatus according to Embodiment 1 of the present invention. Numeral 1 denotes a microlens array having a plurality of spherical or aspherical microlenses 1a arranged in a matrix in the same plane, and numeral 3 denotes a solid-state imaging device (for example, a CCD) having a large number of pixels 3a with a photoelectric conversion function arranged in a matrix in the same plane. One microlens 1a corresponds to a plurality of the pixels 3a, and they form one image forming unit 5. In each image forming unit 5, the microlens 1a forms a subject image on the plurality of the pixels 3a corresponding to this microlens 1a. The microlenses 1a are formed on the surface of the microlens array 1 opposite to the solid-state imaging device 3 (the surface on the subject side).

Figure 2:
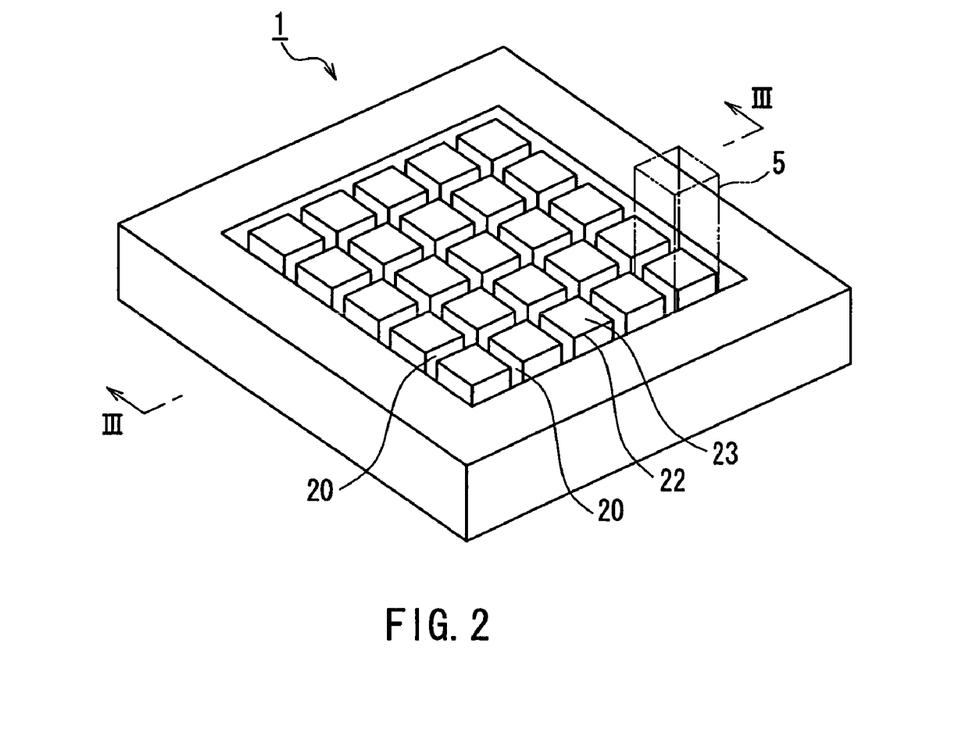
FIG. 2 is a perspective view, seen from a surface on a solid-state imaging device side, showing a microlens array used in the imaging apparatus according to Embodiment 1 of the present invention.
Figure 3:
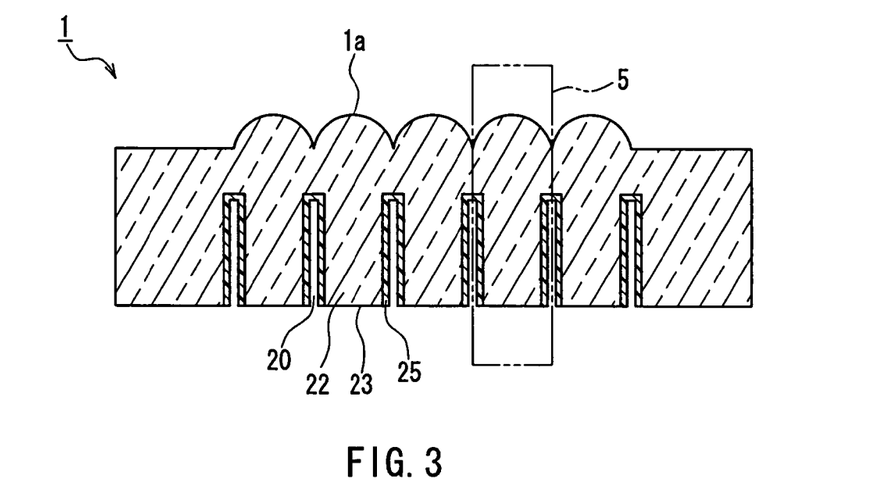
FIG. 3 is a sectional view showing the microlens array seen in a direction indicated by arrows taken along a line III-III in FIG. 2 in Embodiment 1 of the present invention.

FIG. 2 is a perspective view showing the microlens array 1 seen from the surface on the solid-state imaging device side. FIG. 3 is a sectional view showing the microlens array 1 seen in a direction indicated by arrows taken along a line III-III in FIG. 2. The microlens array 1 is formed of a light-transmitting resin and is a plano-convex lens array whose one surface (the surface on the subject side) is provided with the plurality of microlenses 1a and whose other surface (the surface on the side of the solid-state imaging device 3) is substantially flat. This other surface is provided with slit grooves 20 in a lattice form along a border between adjacent image forming units 5. The grooves 20 in the lattice form form quadratic prism portions 22. The microlenses 1a and the quadratic prism portions 22 are in one-to-one correspondence. Light from the subject is focused by the microlens 1a, transmitted inside the quadratic prism portion 22, emitted from an emission portion 23 opposed to the microlens 1a and enters the solid-state imaging device 3 facing the emission portion 23.

Lateral surfaces of the quadratic prism portions 22 (in other words, lateral surfaces of the grooves 20, which are perpendicular to the above-noted other surface of the microlens array 1) are coated with a light-absorbing black coating 25. Since stray light entering this lateral surface is absorbed by the black coating 25, it does not pass through the lateral surface and does not enter the adjacent quadratic prism portion 22.

The depth of the grooves 20 (the height of the quadratic prism portion 22) is larger than a half of the thickness of the microlens array 1. This makes it possible to prevent the phenomenon in which light that has passed through the microlens 1a is emitted from the emission portion 23 of the quadratic prism portion 22 that does not correspond to this microlens 1a, namely, cross talk.

This will be described in detail below.

Figure 4:
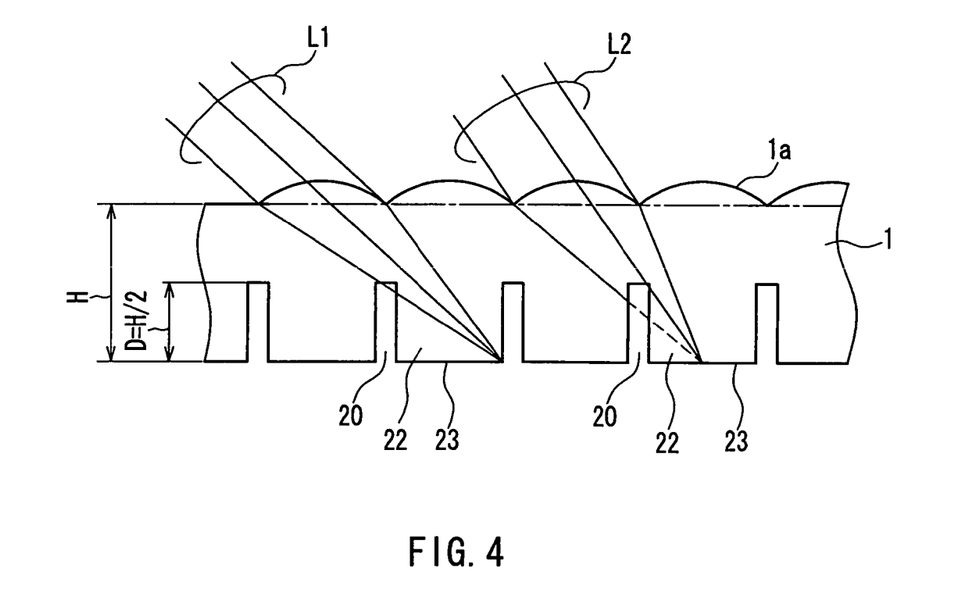
FIG. 4 is a sectional view showing how stray light is generated in the case where the depth of grooves of the microlens array is a half of the thickness of the microlens array.

FIG. 4 is a sectional view showing how the stray light is generated in the case where the depth D of the grooves 20 of the microlens array 1 is a half of the thickness H of the microlens array 1.

In FIG. 4, a light flux L1 entering the microlens 1a obliquely is hardly eclipsed by the groove 20 and reaches the emission portion 23 of the quadratic prism portion 22 that does not correspond to the microlens 1a that the light flux L1 has entered. Thus, in the case where a very bright object is present in an incident angle direction of the light flux L1, the generation of stray light may cause a problem.

In the case where a light flux L2 having a smaller incident angle than the light flux L1 enters the microlens 1a obliquely, a part of the light flux L2 is eclipsed by the groove 20 and the remainder reaches the emission portion 23 of the quadratic prism portion 22 that does not correspond to the microlens 1a that the light flux L2 has entered. Thus, in this case, the intensity of light entering the pixels that do not correspond to the microlens 1a that the light flux has entered is lower than that in the case where the light flux L1 enters as described above. Consequently, less stray light is generated.

In the case where a light flux (not shown) having a larger incident angle than the light flux L1 enters the microlens 1a obliquely, all of this light flux is eclipsed by the groove 20 and does not enter directly the pixels that do not correspond to the microlens 1a that the light flux has entered. Consequently, the generation of stray light can be suppressed substantially.

Figure 5:
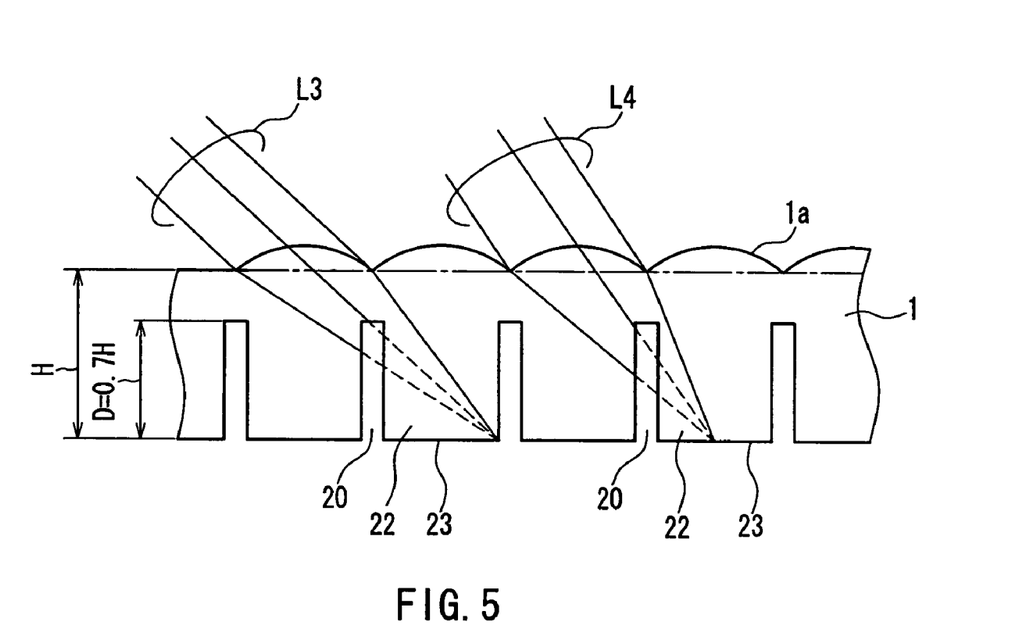
FIG. 5 is a sectional view showing how stray light is suppressed in the case where the depth of the grooves of the microlens array is 70% of the thickness of the microlens array.

FIG. 5 is a sectional view showing how the stray light is suppressed in the case where the depth D of the grooves 20 of the microlens array 1 is 70% of the thickness H of the microlens array 1.

In FIG. 5, in the case where a light flux L3 having the same incident angle as the light flux L1 shown in FIG. 4 enters, about half of the light flux L3 is eclipsed by the groove 20. Thus, in this case, the intensity of light entering the pixels that do not correspond to the microlens 1a that the light flux has entered is lower than that in the case where the light flux L1 enters in FIG. 4. Consequently, less stray light is generated.

In the case where a light flux L4 having a smaller incident angle than the light flux L3 enters the microlens 1a obliquely, at least a half of the light flux L4 is eclipsed by the groove 20 and the slight remainder reaches the emission portion 23 of the quadratic prism portion 22 that does not correspond to the microlens 1a that the light flux L4 has entered. Thus, in this case, the intensity of light entering the pixels that do not correspond to the microlens 1a that the light flux has entered is lowered considerably. Consequently, even less stray light is generated.

In the case where a light flux (not shown) having a larger incident angle than the light flux L3 enters the microlens 1a obliquely, all of this light flux is eclipsed by the groove 20 and does not enter directly the pixels that do not correspond to the microlens 1a that the light flux has entered. Consequently, the generation of stray light can be suppressed substantially.

In FIG. 5, the stray light is most likely to be generated in the case where the light flux L3 enters. The stray light generated in this case is much less than that in the case where the light flux L1 enters in FIG. 4.

As described above, when the depth D of the grooves 20 is set to be larger than a half of the thickness H of the microlens array 1 (D>0.5×H), it is possible to achieve a substantially sufficient light-shielding effect. Incidentally, in the present invention, the thickness H of the microlens array 1 is defined as the thickness of the microlens array 1 except for protruding portions of the microlenses 1a as shown in FIGS. 4 and 5.

In the imaging apparatus of the present embodiment, since the grooves 20 function as the partition 112a in the conventional imaging apparatus shown in FIG. 12, the conventional partition layer 112 is not needed. Thus, the manufacture is easy, and the configuration can be simplified.

Figure 6:
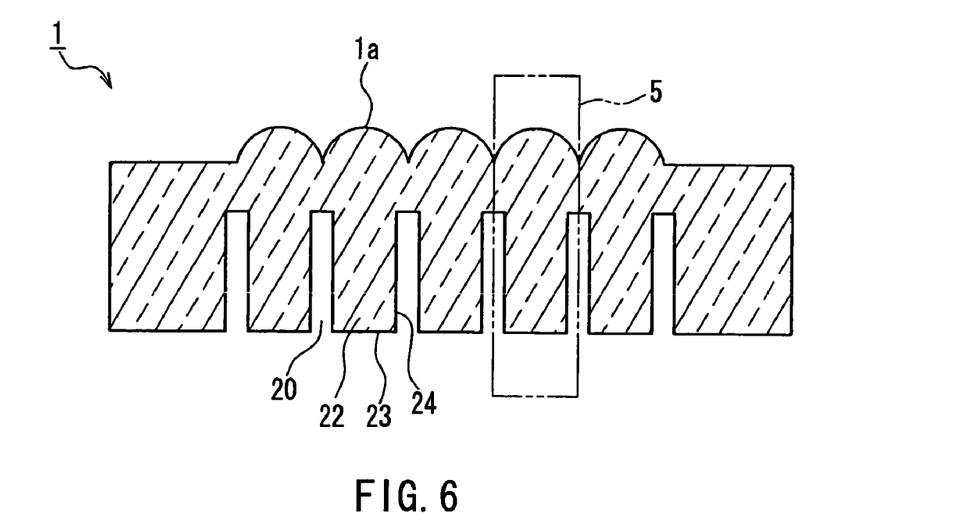
FIG. 6 is a sectional view showing another microlens array used in the imaging apparatus according to Embodiment 1 of the present invention.

Although the present embodiment has described the example in which the lateral surfaces of the grooves 20 are coated with the black coating 25, they also may be processed to have a light-absorption function or a function of attenuating light instead of the black coating 25. In that case, it also is possible to achieve a sufficient light-shielding effect. Further, even if the lateral surfaces of the grooves 20 are not subjected to any special processing as described above, simply providing the grooves 20 as shown in FIG. 6 can reduce the influence of stray light as long as lateral surfaces 24 of the grooves 20 have a necessary and sufficient roughness.

In each image forming unit 5, the microlens 1a forms the subject image on the solid-state imaging device 3. Each of the pixels 3a of the solid-state imaging device 3 converts the incident light into an electrical charge. The images obtained by the individual image forming units 5 are slightly different because the positions of the microlens 1a and the pixels 3a relative to the subject differ from one image forming unit 5 to another. By synthesizing these plural images obtained by the individual image forming units 5 by, for example, the above-described method of JP 2001-61109 A, it is possible to obtain an image with a far higher resolution than the number of pixels 3a included in one image forming unit 5.

EMBODIMENT 2

Figure 7:
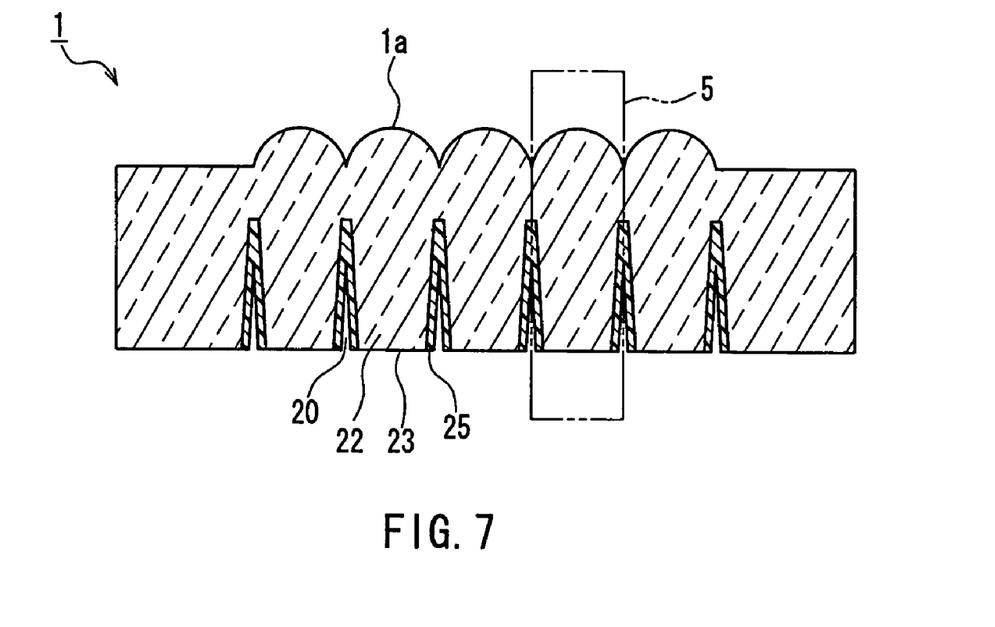
FIG. 7 is a sectional view showing a microlens array used in an imaging apparatus according to Embodiment 2 of the present invention.

FIG. 7 is a sectional view showing a microlens array 1 used in an imaging apparatus according to Embodiment 2. The elements that are the same as those in Embodiment 1 are assigned the same reference numerals, and the description thereof will be omitted.

In Embodiment 2, the width (the dimension in a direction parallel with the plane in which microlenses 1a are arranged) of grooves 20 in a lattice form formed in the microlens array 1 increases gradually from the side of the microlens 1a to the side of the surface facing the solid-state imaging device 3. In this respect, Embodiment 2 is different from Embodiment 1 in which the width of the grooves 20 is substantially constant. By changing the width of the grooves 20 as in the present embodiment, the microlens array 1 can be released easily from a mold when it is resin-molded, so that the productivity improves.

The microlens array 1 is similar to that shown in FIG. 3 in that the lateral surfaces of the grooves 20 are coated with a light-absorbing black coating 25.

Figure 8:
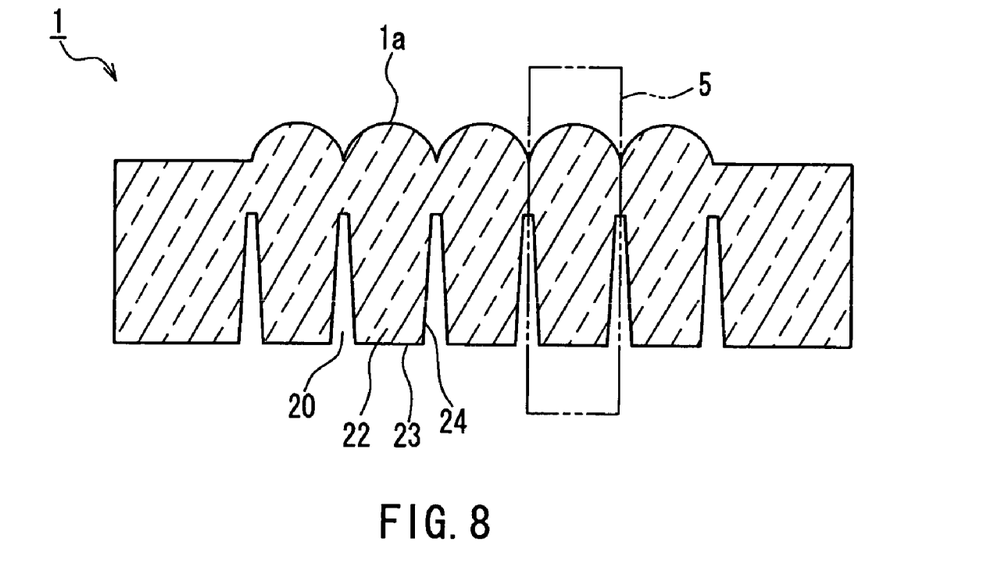
FIG. 8 is a sectional view showing another microlens array used in the imaging apparatus according to Embodiment 2 of the present invention.

In the case where the width of the grooves 20 is changed as in the present embodiment, it is possible to omit the black coating on the lateral surfaces 24 of the grooves 20 as shown in FIG. 8. The reason is that, when stray light emitted from the quadratic prism portion 22 to the inside of the groove 20 enters the lateral surface 24 of the adjacent quadratic prism portion 22, its incident angle is large, so that it is more likely to be reflected without entering this quadratic prism portion 22, thus reducing the influence of the stray light sufficiently.

EMBODIMENT 3

Figure 9:
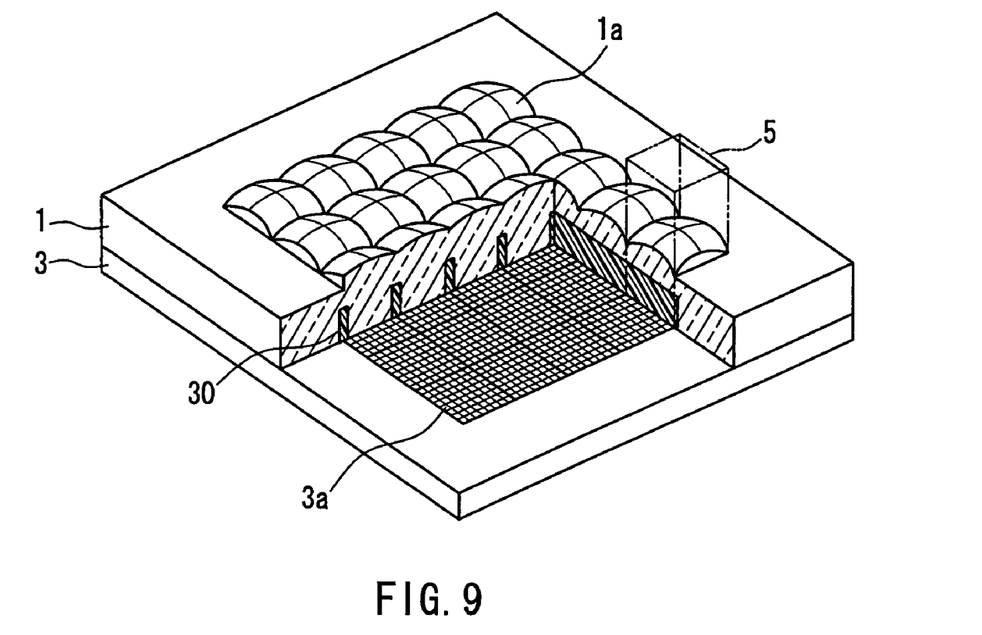
FIG. 9 is a partially broken perspective view showing an imaging apparatus according to Embodiment 3 of the present invention.
Figure 10:
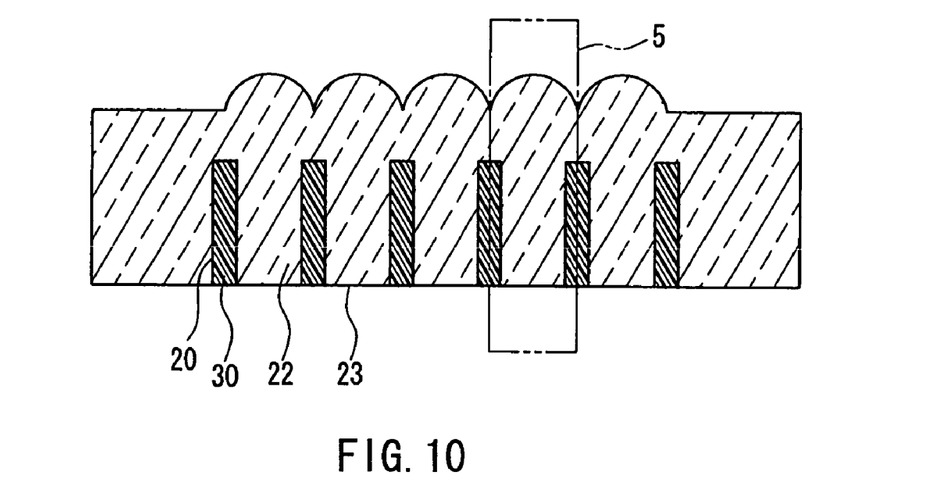
FIG. 10 is a sectional view showing a microlens array used in an imaging apparatus according to Embodiment 3 of the present invention.

FIG. 9 is a partially broken perspective view showing an imaging apparatus according to Embodiment 3 of the present invention. FIG. 10 is a sectional view showing a microlens array 1 used in the imaging apparatus according to Embodiment 3. The elements that are the same as those in Embodiment 1 are assigned the same reference numerals, and the description thereof will be omitted.

In Embodiment 3, a black resin 30 is filled in slit grooves 20 formed in a lattice form along a border between adjacent image forming units 5 in the surface of the microlens array 1 on the side of a solid-state imaging device 3. The resin 30 is formed of a material having a smaller light transmittance than a material of the microlens array 1 including microlenses 1a.

Since light that has passed through the microlens 1a and then entered this groove 20 is absorbed by the black resin 30, it does not pass through the black resin 30 and does not enter the adjacent quadratic prism portion 22.

Also, by filling the resin 30 into the grooves 20, the strength of the microlens array 1 increases, thus achieving easier handling when assembling the apparatus.

Further, in the case where the material of the resin 30 has a larger refractive index than that of the microlens array 1, light entering an interface between the quadratic prism portion 22 and the resin 30 from the quadratic prism portion 22 is not totally-reflected easily by this interface, so that the stray light is absorbed by the resin 30 more easily. Thus, the influence of the stray light can be reduced further.

Although FIG. 10 has described the case where the width of the grooves 20 (or the black resin 30) is constant in the thickness direction, the width also may increase gradually from the side of the microlens 1a to the side of the surface facing the solid-state imaging device 3 similarly to Embodiment 2 (see FIGS. 7 and 8). In that case, an effect similar to that described in Embodiment 2 can be produced.

Other than the above, a description similar to Embodiment 1 applies to the present embodiment.

EMBODIMENT 4

FIGS. 11A to 11D are sectional views showing a process sequence of an example of a method for manufacturing a microlens array 1 according to the present invention. Referring to these figures, the method for manufacturing the microlens array 1 will be described.

Figure 11A:
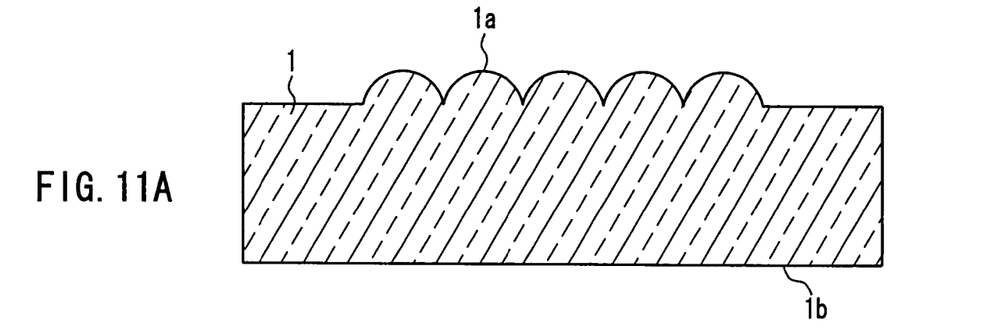
FIG. 11A is a sectional view showing a process of an example of a method for manufacturing a microlens array according to the present invention.

First, as shown in FIG. 11A, a plano-convex microlens array 1 whose one surface is provided with a plurality of microlenses 1a and whose other surface is a flat surface 1b is formed by resin molding (for example, injection molding).

Figure 11B:
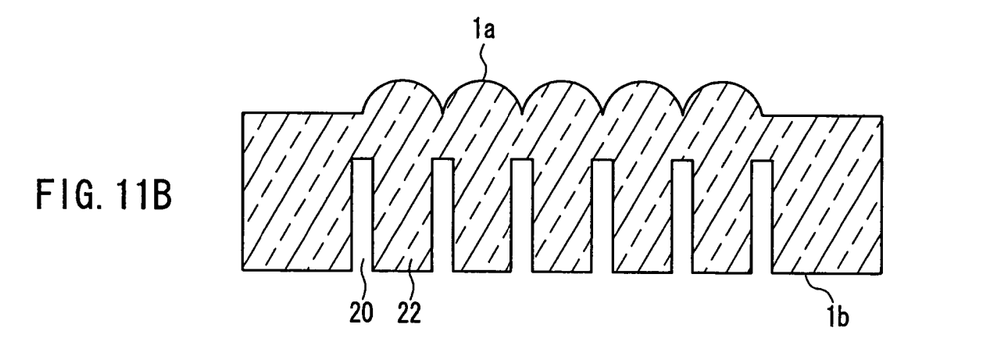
FIG. 11B is a sectional view showing a process of an example of the method for manufacturing a microlens array according to the present invention.

Next, as shown in FIG. 11B, grooves 20 are formed in a lattice form from the side of the flat surface 1b by laser processing.

Figure 11C:
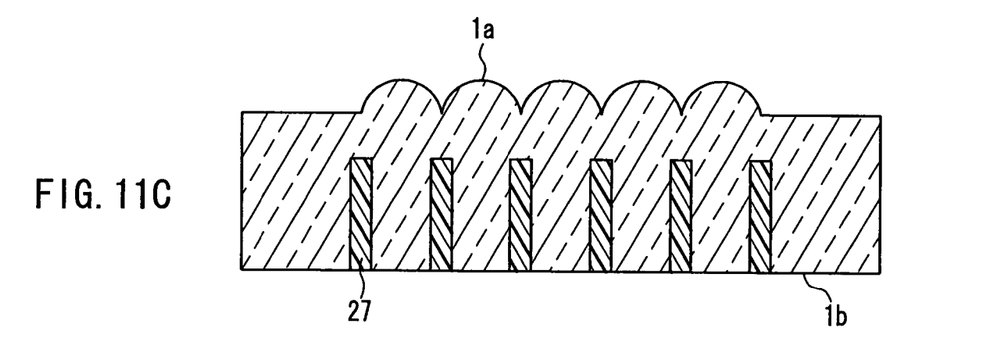
FIG. 11C is a sectional view showing a process of an example of the method for manufacturing a microlens array according to the present invention.

Subsequently, as shown in FIG. 11C, a solution 27 prepared by dissolving a black coating material in a solvent is poured into the grooves 20.

Figure 11D:
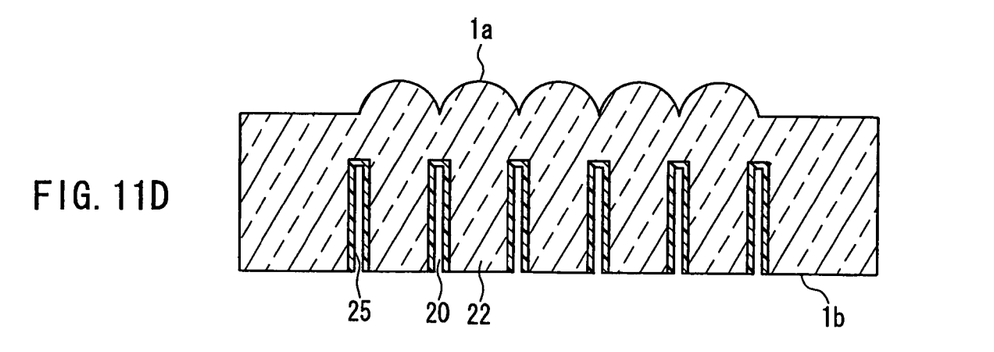
FIG. 11D is a sectional view showing a process of an example of the method for manufacturing a microlens array according to the present invention.

By drying the solution 27, a black coating 25 is completed on the lateral surfaces of the grooves 20 as shown in FIG. 11D.

By increasing the content of the black coating material in the solution 27 in FIG. 11C and/or repeating the processes shown in FIGS. 11C and 11D plural times, it is possible to obtain the microlens array 1 whose grooves 20 are filled with the resin as illustrated in Embodiment 3.

Incidentally, the grooves 20 also can be processed by resin molding at the same time with molding the microlenses 1a instead of the laser processing.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

INDUSTRIAL APPLICABILITY

The present invention is applicable to any fields with no particular limitation but can be used preferably in a thin imaging apparatus such as a card-shaped camera apparatus.

The invention claimed is:

1. An imaging apparatus, comprising:
   an imaging device comprising a plurality of pixels having a photoelectric conversion function; and
   a microlens array comprising a plurality of microlenses that form subject images on the plurality of pixels in the imaging device and are arranged in a matrix;
   wherein the microlens array comprises grooves in a lattice form between the microlenses that are adjacent to each other, and a depth of the grooves is larger than a half and 70% or less of a thickness of the microlens array except for protruding portions of the microlenses, and
   wherein the microlens array is formed as a single unitary structure.

2. The imaging apparatus according to claim 1, wherein a material of the microlens array comprises a light-transmitting resin.

3. The imaging apparatus according to claim 1, wherein the microlens array is a plano-convex lens array whose one surface is provided with the microlenses and whose other surface is provided with the grooves and faces the imaging device.

4. The imaging apparatus according to claim 1, wherein a light-absorbing material is applied to lateral surfaces of the grooves.

5. The imaging apparatus according to claim 4, wherein the light-absorbing material is black.

6. The imaging apparatus according to claim 1, wherein a width of the grooves increases toward the imaging device.

7. The imaging apparatus according to claim 1, wherein a second material having a smaller light transmittance than a first material forming the microlens array is filled in the grooves.

8. The imaging apparatus according to claim 7, wherein the second material comprises a material having a light-absorption function.

9. The imaging apparatus according to claim 7, wherein the second material has a larger refractive index than the first material.

10. The imaging apparatus according to claim 1, wherein the microlens array is manufactured by a resin molding.

* * * * *